United States Patent
Neely

[11] Patent Number: 5,705,956
[45] Date of Patent: Jan. 6, 1998

[54] NEURAL NETWORK BASED PLL

[75] Inventor: William Shields Neely, Campbell, Calif.

[73] Assignee: National Semiconductor Corporation, Santa Clara, Calif.

[21] Appl. No.: 678,969

[22] Filed: Jul. 12, 1996

[51] Int. Cl.$^6$ .......................... H03L 7/085; G05B 13/04; G06F 15/18
[52] U.S. Cl. ................................ 331/25; 364/150; 395/23
[58] Field of Search ...................... 331/25, 27; 364/150; 395/23

[56] References Cited

U.S. PATENT DOCUMENTS 5,175,678  12/1992  Frerichs et al. ............................ 364/148
5,446,828   8/1995  Woodall ..................................... 395/23
5,471,381  11/1995  Khan ......................................... 364/148

*Primary Examiner*—Siegfried H. Grimm
*Attorney, Agent, or Firm*—Limbach & Limbach L.L.P.

[57] ABSTRACT

A neural network controlled phase lock loop (PLL) with an artificial neural network for comparing the phase of the feedback signal from the voltage controlled oscillator (VCO) with the phase of the PLL reference signal. The VCO feedback signal and PLL reference signal are inputted to and processed by a multiple layer perception which has been trained with a model of the VCO to generate the appropriate control voltage necessary to establish and maintain the desired phase and/or frequency of the VCO output signal.

34 Claims, 5 Drawing Sheets

NEURAL NETWORK BASED PLL

BACKGROUND OF THE INVENTION

1. Field of the Invention

The present invention relates to phase lock loops (PLLs), and in particular, to PLLs in which a neural network is used to perform the phase comparison between the oscillator output signal and reference signal.

2. Description of the Related Art

In a typical conventional PLL, a voltage controlled oscillator (VCO), in accordance with an input control voltage, generates an output signal at a predetermined frequency. This output signal is fed back to a phase comparator which compares the phase of the oscillator output signal to that of an input reference signal. Based upon this comparison, the phase comparator generates an error signal having a polarity which corresponds and a magnitude which is proportional to the difference between the phases of the two input signals. This output error signal from the comparator is then filtered to provide the input control voltage to the VCO.

One common problem encountered when designing such a PLL is that of making the transfer function of the VCO, i.e., its output frequency versus its input control voltage, sufficiently linear. Due to the nature of the tunable components necessary for constructing a VCO, achieving consistently linear transfer functions is difficult. If the resulting non-linearities in the VCO transfer function become significant, the PLL may have difficulty achieving phase lock and its phase locking speed may be slower than desired. While a number of corrective techniques have been developed to overcome problems with non-linear VCO transfer functions, such as the use of lookup tables with predetermined correction factors, such techniques require additional hardware and power and often result in further reductions in phase locking speed as well as other measures of performance.

Accordingly, it would be desirable to have a PLL design which is significantly less dependent upon and less affected by non-linearities in the VCO transfer function.

SUMMARY OF THE INVENTION

In accordance with one embodiment of the present invention, a neural network controlled oscillator loop includes a neural network signal processor and an oscillator. The neural network signal processor is configured to receive and process a reference signal and an oscillator signal and in accordance therewith provide a control signal. The reference signal includes a reference phase and a reference frequency and the oscillator signal includes an oscillator phase and an oscillator frequency. The oscillator is coupled to the neural network signal processor and is configured to receive the control signal and in accordance therewith provide the oscillator signal. At least one of either the oscillator phase or oscillator frequency is controlled by the control signal and is established in accordance with at least one of either the reference phase or reference frequency, respectively.

In accordance with another embodiment of the present invention, a neural network system having a neural network signal processor and configured to train such neural network signal processor for controlling an oscillator includes a neural network signal processor, an inverse circuit model and an error detection circuit. The neural network signal processor is configured to receive and back propagate an error signal and to receive and process a desired response signal and an example input signal and in accordance therewith provide a control signal. The error signal corresponds to a difference between the desired response signal and example input signal. The inverse circuit model is coupled to the neural network signal processor and is configured to receive the desired response signal and in accordance therewith provide an inverse model signal. The inverse circuit model has a transfer function associated therewith and a ratio of the control signal and the example input signal correspond to an inverse of such transfer function. The error detection circuit is coupled to the neural network signal processor and inverse circuit model and is configured to receive and process the control signal and the inverse model signal and in accordance therewith provide the error signal.

These and other features and advantages of the present invention will be understood upon consideration of the following detailed description of the invention and the accompanying drawings.

DETAIL DESCRIPTION OF THE INVENTION

Throughout the following discussion, the use of VCOs and phase comparison in PLLs is discussed. However, it should be understood that the principles and techniques of the present invention are equally applicable to synchronous loops which use current controlled oscillators with control currents instead of control voltages, as well as frequency lock loops which compare frequencies rather than phases between the oscillator output and reference signals.

Figure 1:
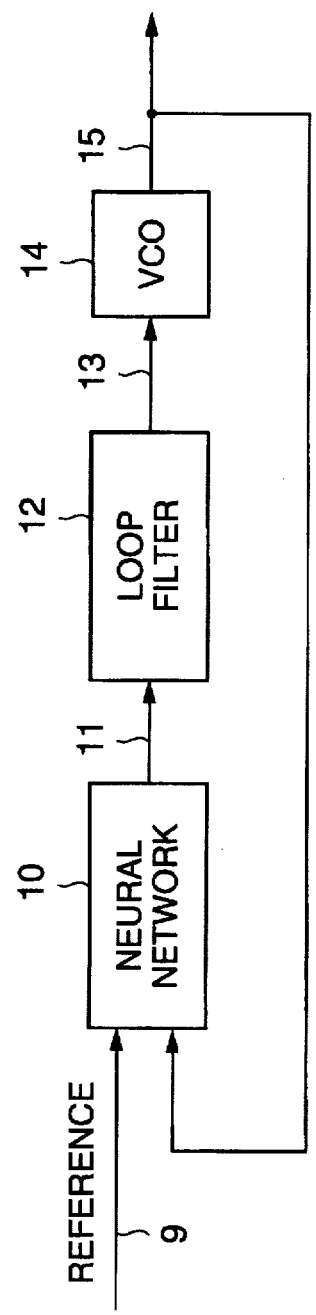
FIG. 1 is a functional block diagram of a neural network based PLL in accordance with one embodiment of the present invention.

Referring to FIG. 1, a neural network based PLL in accordance with the present invention includes a neural network 10, a loop filter 12 and VCO 14, interconnected as shown. The neural network 10 receives a reference signal 9, having a reference phase and frequency, and the output signal 15 from the VCO. The neural network 10 compares the phase of the VCO output signal 15 to that of the reference signal 9 and produces a control, or error, signal 11 having a polarity and magnitude which correspond to the difference, if any, between the phases of the VCO output signal 15 and reference signal 9. This control signal 11 is filtered by the loop filter 12 (e.g., low pass filter) to reduce its noise content. This filtered signal 13 serves as the control voltage for the VCO 14.

Figure 2:
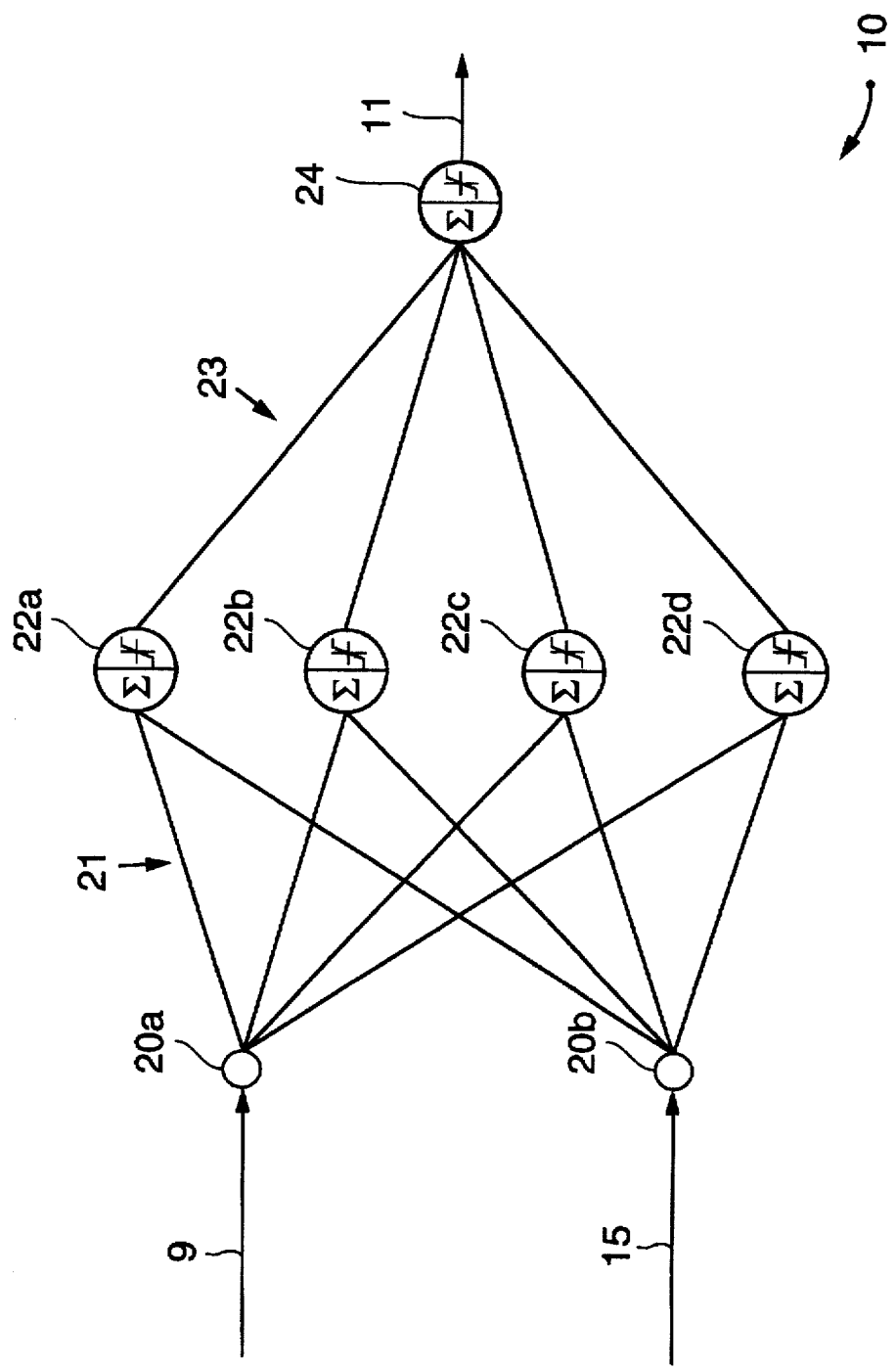
FIG. 2 is a functional block diagram of an example of a neural network suitable for use in the PLL of FIG. 1.

Referring to FIG. 2, the neural network 10 of FIG. 1 is preferably a two-input multiple layer perceptron having a single output node for producing the control signal 11. The reference signal 9 and VCO output signal 15 are received via two input nodes 20a, 20b for distribution within the network. The neurons 22 within the middle layer receive and sum the distributed signals 21, process such sums in accordance with neural functions (e.g., sigmoid functions) and provide the results 23 for summation and processing by the output node 24.

Figure 3:
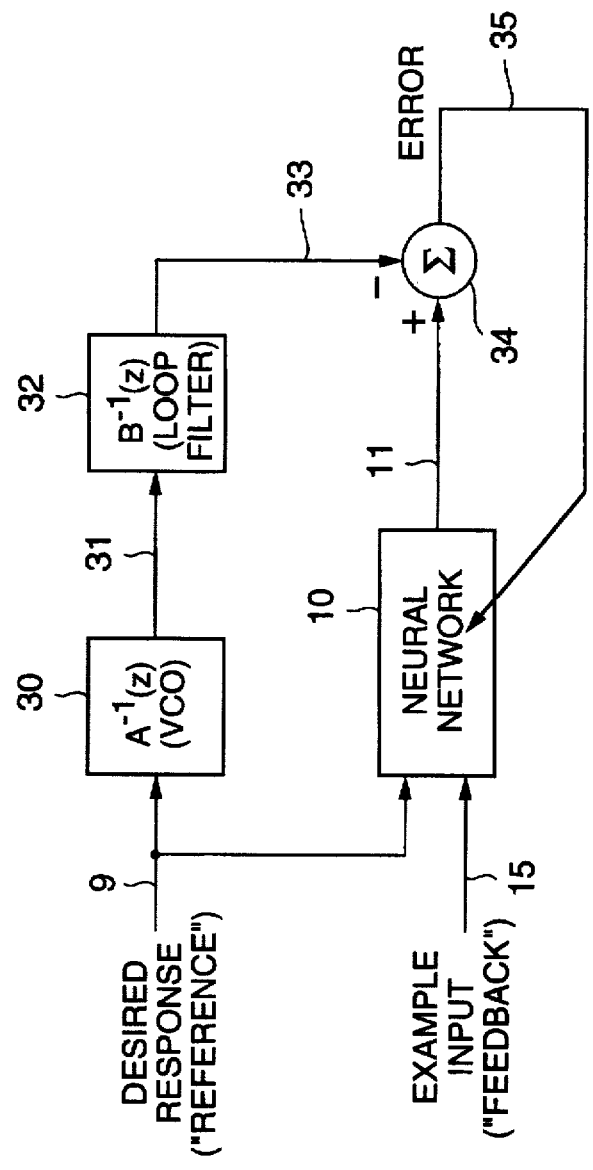
FIG. 3 is a functional block diagram of a neural network system configured to train the neural network of FIG. 1.

Referring to FIG. 3, a neural network system configured to train the neural network 10 of FIG. 1 can be implemented as shown. The desired response, or reference, signal 9 is inputted to the neural network 10 and to an inverse circuit model 30 corresponding to the VCO. An example input, or VCO feedback, signal 15 is also inputted to the neural network 10. The output 31 from the VCO inverse circuit model 30 is then processed by a second inverse circuit model 32 which corresponds to the loop filter. (The transfer functions of the VCO 30 and loop filter 32 inverse circuit models are the inverses of the transfer functions of the VCO and loop filter, respectively, with which the neural network 10 is intended to ultimately operate, and together have an overall transfer function the inverse of which corresponds to a ratio of the control signal 11 and example input signal 15.) The control signal 11 from the neural network 10 is differentially summed with the output 33 of the loop filter inverse circuit model 32. The resulting error signal 35 is fed back to and back propagated through the neural network 10 for back propagation (in accordance with well known techniques) for training the neural network 10.

Figure 4:
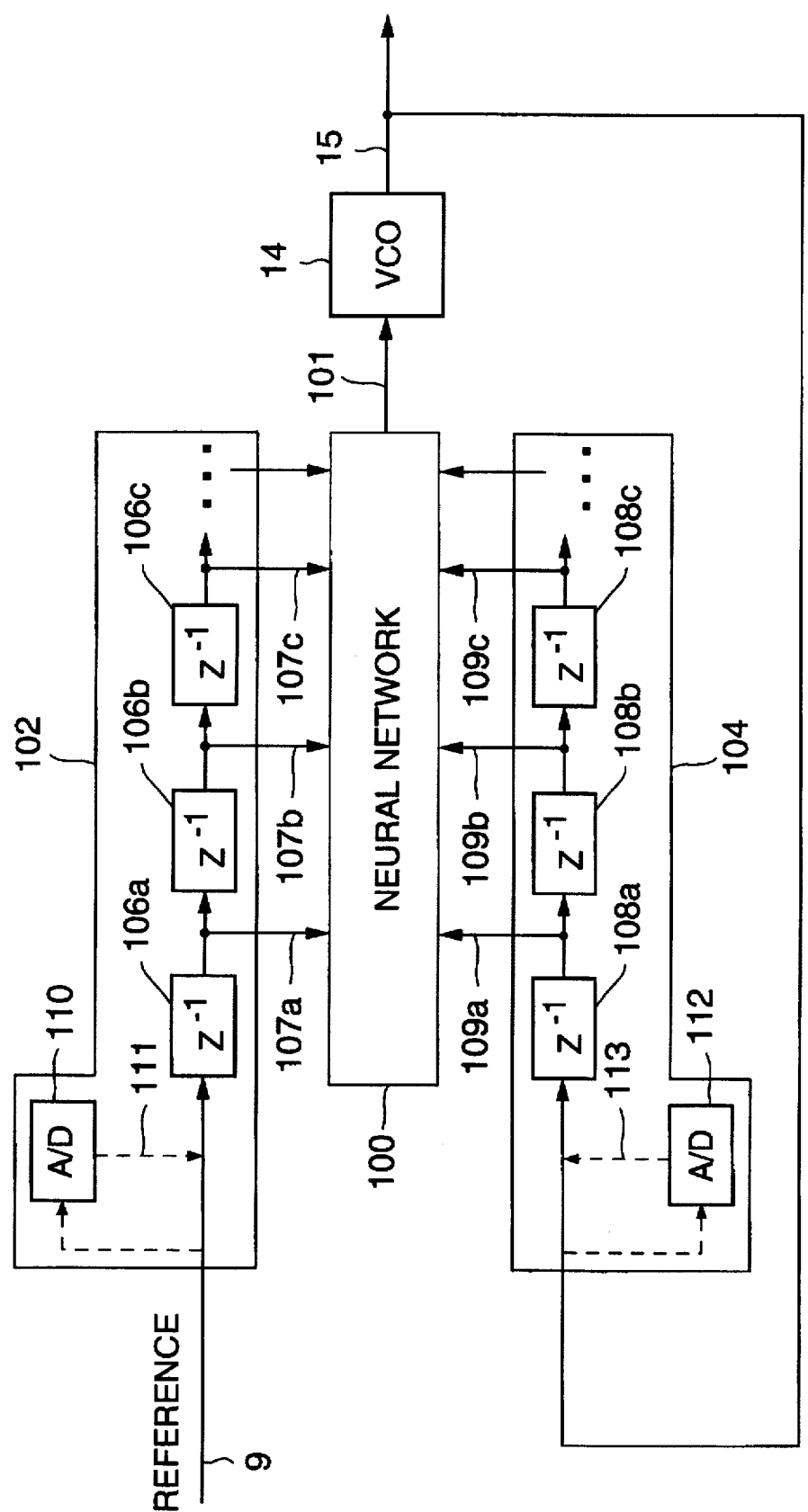
FIG. 4 is a functional block diagram of a neural network based PLL in accordance with another embodiment of the present invention.

Referring to FIG. 4, a neural network based PLL in accordance with another embodiment of the present invention includes a neural network 100, two preprocessors 102, 104 and the VCO 14, interconnected as shown. In accordance with its input control voltage 101, the VCO 14 generates an oscillator output signal 15. The reference signal 9 and oscillator output signal 15 are inputted to their respective preprocessor 102, 104. Each preprocessor includes a series of unit time delay elements 106, 108 which receive and sequentially time delay their respective analog input signals 9, 15 to produce two series of discrete signal samples 107, 109 of the corresponding analog input signals 9, 15. According to one embodiment, these preprocessors 102, 104 include tapped delay lines. According to another embodiment, these preprocessors 102, 104 include analog-to-digital converters (ADCs) 110, 112 and serial shift registers. The ADCs 110, 112 digitize the analog input signals 9, 15 and the individual registers 106, 108 of the shift registers serially shift the digitized input signals 111, 113 to produce the sample sequences 107, 109.

The neural network 100 receives these sample sequence signals 107, 109 and processes them together to produce the control voltage signal 101 for the VCO 14. With appropriate training, and due to the time sampling of the reference 9 and oscillator output 15 signals, the loop filter function can be incorporated within the neural network 100, thereby eliminating the need for a separate loop filter.

Figure 5:
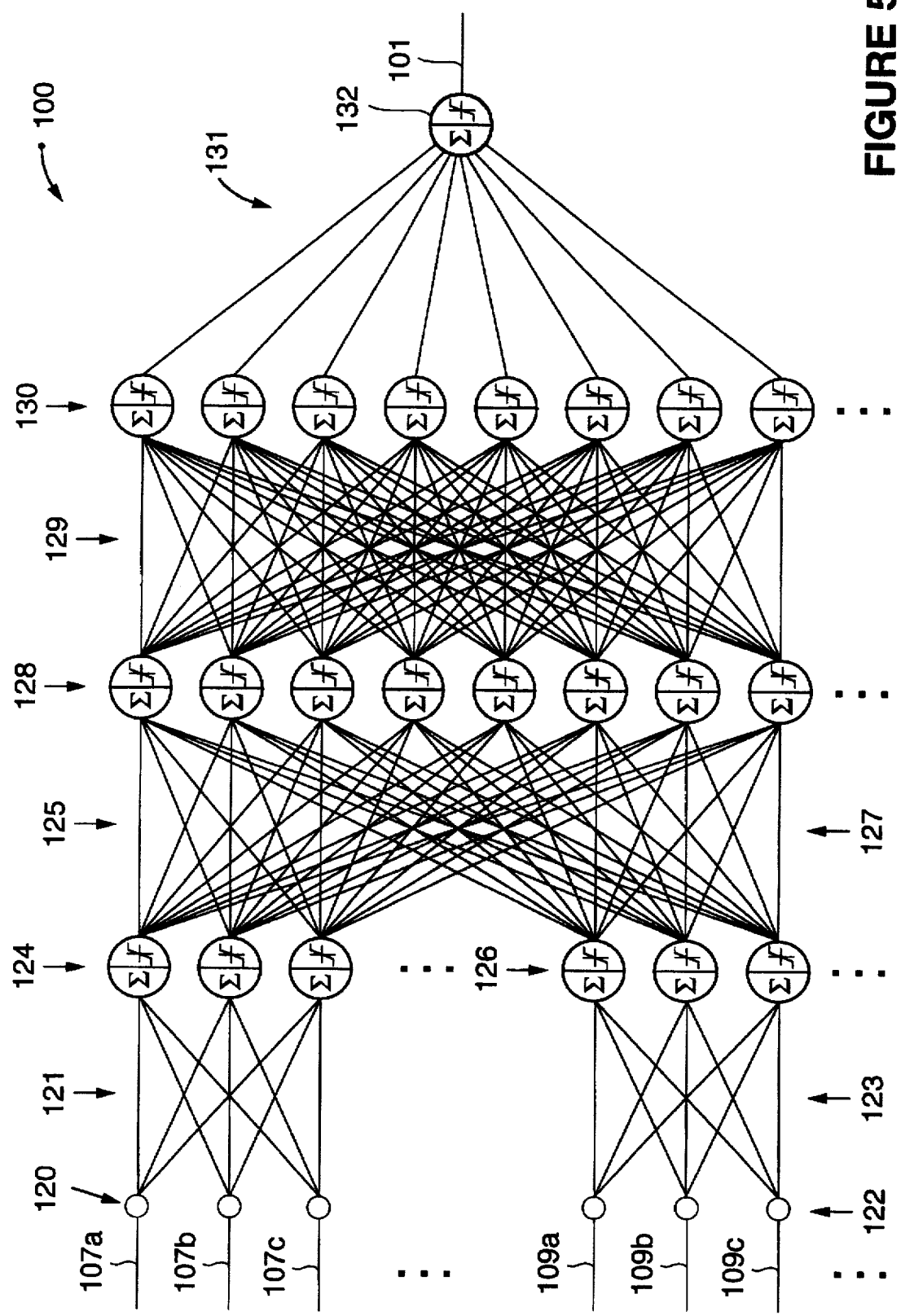
FIG. 5 is a functional block diagram of an example of a neural network suitable for use in the PLL of FIG. 4.

Referring to FIG. 5, the neural network 100 of FIG. 4 is preferably a multiple input, multiple layer perceptron with a single output node, and can be implemented as shown. The signal samples 107, 109 are inputted to two sets of input nodes 120, 122 for distribution within the network. The distributed signals 121, 123 are received, summed and processed (e.g., in accordance with sigmoid functions) by two sets of input layer neurons 124, 126. These processed signals 125, 127 are then distributed to and summed and processed by the next layer of neurons 128. In turn, these processed signals 129 are further distributed to and summed and processed by the next layer of neurons 130. The final processed signals 131 are then summed and processed by the output node 132 to generate the control voltage signal 101.

Figure 6:
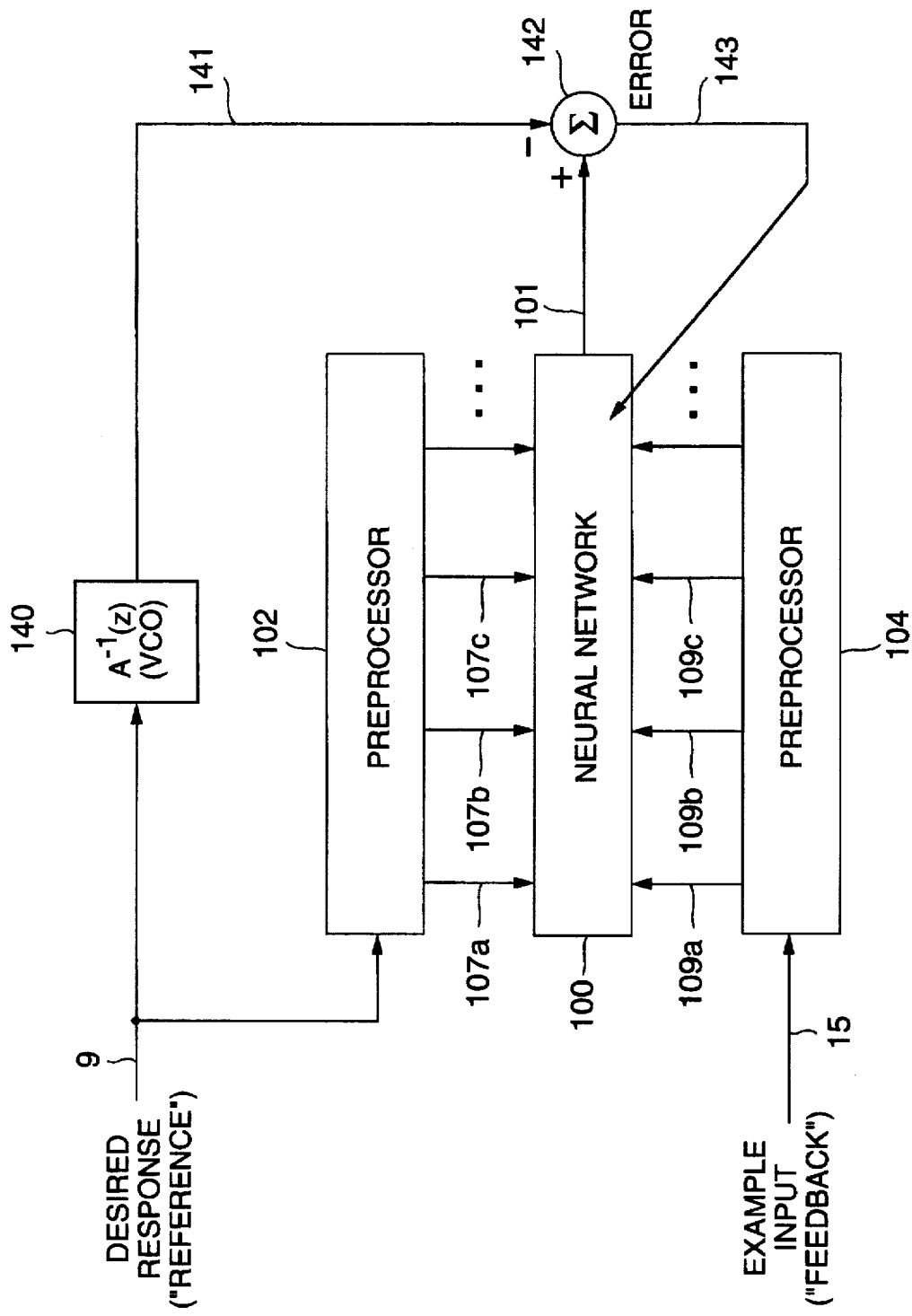
FIG. 6 is a functional block diagram of a neural network system configured to train the neural network of FIG. 4.

Referring to FIG. 6, a neural network system configured for training the neural network 100 of FIG. 4 can be implemented as shown. The desired response, or reference, signal 9 is inputted to the first preprocessor 102 and to a VCO inverse circuit model 140. The example input, or VCO feedback, signal 15 is inputted to the other preprocessor 104. As discussed above, the preprocessors 102, 104 provide discrete signal samples 107, 109 to the neural network 100 which processes such signals to generate the control voltage signal 101. The output 141 from the VCO inverse circuit model 140 (processed in accordance with the transfer function of the VCO inverse circuit model 140 which is the inverse of the VCO with which the neural network 100 is intended to ultimately operate) is differentially summed with the control voltage signal 101. The resulting error signal 143 is fed back to and back propagated through the neural network 100 for training thereof.

Based upon the foregoing, it can be seen that a number of advantages are realized in using a neural network based PLL. If the neural network is constructed using fast analog circuit techniques, high speed can be obtained. Further, the process of designing a PLL for the desired operational characteristics can be simplified by simulating the entire structure and using observed data about a representative input signal, the desired VCO output signal and the VCO input signal required to generate such a VCO output signal. This data can then be used to design the required neural network. Perhaps most importantly, the ability of a neural network to learn based upon arbitrary data significantly reduces the criticality of the linearity (or non-linearity) of the VCO transfer function. Additionally, with appropriate time sampling of the input reference and VCO signals, the loop filter function can be incorporated into the neural network.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a neural network controlled oscillator loop comprising:
  a neural network signal processor configured to receive and process a reference signal and an oscillator signal and in accordance therewith provide a control signal, wherein said reference signal includes a reference phase and a reference frequency and said oscillator signal includes an oscillator phase and an oscillator frequency; and
  an oscillator, coupled to said neural network signal processor, configured to receive said control signal and in accordance therewith provide said oscillator signal, wherein at least one of said oscillator phase and frequency is controlled by said control signal and is established in accordance with at least one of said reference phase and frequency, respectively.

2. The apparatus of claim 1, wherein said neural network signal processor comprises a multiple layer perceptron which includes first and second inputs configured to receive said reference signal and said oscillator signal and an output configured to provide said control signal.

3. The apparatus of claim 1, wherein said neural network signal processor comprises:

a plurality of preprocessors configured to receive said reference signal and said oscillator signal and in accordance therewith provide first and second pluralities of temporally related signals; and a neural network, coupled to said plurality of preprocessors, configured to receive and process said first and second pluralities of temporally related signals together simultaneously and in accordance therewith provide said control signal.

4. The apparatus of claim 3, wherein said plurality of preprocessors comprises first and second tapped delay lines configured to receive and sequentially time delay said reference signal and said oscillator signal and in accordance therewith provide first and second pluralities of sequentially time delayed signals as said first and second pluralities of temporally related signals.

5. The apparatus of claim 3, wherein said plurality of preprocessors comprises first and second shift registers configured to receive and selectively shift said reference signal and said oscillator signal and in accordance therewith provide first and second pluralities of sequentially time shifted signals as said first and second pluralities of temporally related signals.

6. The apparatus of claim 3, wherein said neural network comprises a multiple layer perception which includes first and second pluralities of inputs configured to receive said first and second pluralities of temporally related signals and an output configured to provide said control signal.

7. The apparatus of claim 1, further comprising a filter, coupled between said neural network and said oscillator, configured to filter said control signal.

8. The apparatus of claim 1, wherein said oscillator comprises a voltage controlled oscillator and said control signal comprises a control voltage.

9. The apparatus of claim 1, wherein said oscillator comprises a current controlled oscillator and said control signal comprises a control current.

10. A neural network system which includes a neural network signal processor and is configured to train said neural network signal processor for controlling an oscillator, said neural network system comprising:

a neural network signal processor configured to receive and back propagate an error signal and to receive and process a desired response signal and an example input signal and in accordance therewith provide a control signal, wherein said error signal corresponds to a difference between said desired response signal and said example input signal;

an inverse circuit model, coupled to said neural network signal processor, configured to receive said desired response signal and in accordance therewith provide an inverse model signal, wherein said inverse circuit model has a transfer function associated therewith and a ratio of said control signal and said example input signal correspond to an inverse of said transfer function; and an error detection circuit, coupled to said neural network signal processor and said inverse circuit model, configured to receive and process said control signal and said inverse model signal and in accordance therewith provide said error signal.

11. The neural network system of claim 10, wherein said neural network signal processor comprises a multiple layer perceptron which includes first and second inputs configured to receive said desired response signal and said example input signal and an output configured to provide said control signal.

12. The neural network system of claim 10, wherein said neural network signal processor comprises:

a plurality of preprocessors configured to receive said desired response signal and said example input signal and in accordance therewith provide first and second pluralities of temporally related signals; and a neural network, coupled to said plurality of preprocessors, configured to receive and back propagate said error signal and to receive and process said first and second pluralities of temporally related signals together simultaneously and in accordance therewith provide said control signal.

13. The neural network system of claim 12, wherein said plurality of preprocessors comprises first and second tapped delay lines configured to receive and sequentially time delay said desired response signal and said example input signal and in accordance therewith provide first and second pluralities of sequentially time delayed signals as said first and second pluralities of temporally related signals.

14. The neural network system of claim 12, wherein said plurality of preprocessors comprises first and second shift registers configured to receive and selectively shift said desired response signal and said example input signal and in accordance therewith provide first and second pluralities of sequentially time shifted signals as said first and second pluralities of temporally related signals.

15. The neural network system of claim 12, wherein said neural network comprises a multiple layer perceptron which includes first and second pluralities of inputs configured to receive said first and second pluralities of temporally related signals and an output configured to provide said control signal.

16. The neural network system of claim 10, wherein said error detection circuit comprises a signal combiner configured to receive and combine said control signal and said inverse model signal and in accordance therewith provide said error signal.

17. The neural network system of claim 10, wherein said inverse circuit model represents an inverse circuit model of a signal controlled oscillator.

18. The neural network system of claim 10, wherein said inverse circuit model represents an inverse circuit model of a serially coupled signal controlled oscillator and filter.

19. A neural network based method of controlling an oscillator comprising the steps of:

receiving and processing a reference signal and an oscillator signal and in accordance therewith generating a control signal with a neural network signal processor, wherein said reference signal includes a reference phase and a reference frequency and said oscillator signal includes an oscillator phase and an oscillator frequency; and receiving said control signal and in accordance therewith generating said oscillator signal, wherein at least one of said oscillator phase and frequency is controlled by said control signal and is established in accordance with at least one of said reference phase and frequency, respectively.

20. The method of claim 19, wherein said step of receiving and processing a reference signal and an oscillator signal and in accordance therewith generating a control signal with a neural network signal processor comprises receiving said reference signal and said oscillator signal via first and second inputs of a multiple layer perceptron and processing said reference signal and said oscillator signal to generate said control signal and outputting said control signal with said multiple layer perceptron.

21. The method of claim 19, wherein said step of receiving and processing a reference signal and an oscillator signal and in accordance therewith generating a control signal with a neural network signal processor comprises:

receiving said reference signal and said oscillator signal and in accordance therewith generating first and second pluralities of temporally related signals; and receiving and processing said first and second pluralities of temporally related signals together simultaneously and in accordance therewith generating said control signal with a neural network.

22. The method of claim 21, wherein said step of receiving said reference signal and said oscillator signal and in accordance therewith generating first and second pluralities of temporally related signals comprises receiving and sequentially time delaying said reference signal and said oscillator signal and in accordance therewith generating first and second pluralities of sequentially time delayed signals as said first and second pluralities of temporally related signals.

23. The method of claim 21, wherein said step of receiving said reference signal and said oscillator signal and in accordance therewith generating first and second pluralities of temporally related signals comprises receiving and selectively shifting said reference signal and said oscillator signal and in accordance therewith generating first and second pluralities of sequentially time shifted signals as said first and second pluralities of temporally related signals.

24. The method of claim 21, wherein said step of receiving and processing said first and second pluralities of temporally related signals together simultaneously and in accordance therewith generating said control signal with a neural network comprises receiving said first and second pluralities of temporally related signals via first and second pluralities of inputs of a multiple layer perception and processing said first and second pluralities of temporally related signals to generate said control signal and outputting said control signal with said multiple layer perceptron.

25. The method of claim 19, further comprising the step of filtering said control signal.

26. A method of training a neural network signal processor for controlling an oscillator, said method comprising the steps of:

receiving and back propagating an error signal with a neural network signal processor;

receiving and processing a desired response signal and an example input signal and in accordance therewith generating a control signal with said neural network signal processor;

receiving said desired response signal and generating an inverse model signal in accordance with a transfer function, wherein a ratio of said control signal and said example input signal correspond to an inverse of said transfer function; and processing said control signal and said inverse model signal and in accordance therewith generating said error signal, wherein said error signal corresponds to a difference between said desired response signal and said example input signal.

27. The method of claim 26, wherein:

said step of receiving and back propagating an error signal with a neural network signal processor comprises receiving and back propagating an error signal with a multiple layer perceptron; and said step of receiving and processing a desired response signal and an example input signal and in accordance therewith generating a control signal with said neural network signal processor comprises inputting said desired response signal and said example input signal to first and second inputs and outputting said control signal from an output of said multiple layer perceptron.

28. The method of claim 26, wherein:

said step of receiving and back propagating an error signal with a neural network signal processor comprises receiving and back propagating an error signal with a neural network; and said step of receiving and processing a desired response signal and an example input signal and in accordance therewith generating a control signal with said neural network signal processor comprises:

receiving said desired response signal and said example input signal and in accordance therewith generating first and second pluralities of temporally related signals; and processing said first and second pluralities of temporally related signals together simultaneously and in accordance therewith generating said control signal with said neural network.

29. The method of claim 28, wherein said step of receiving said desired response signal and said example input signal and in accordance therewith generating first and second pluralities of temporally related signals comprises receiving and sequentially time delaying said desired response signal and said example input signal with first and second tapped delay lines and in accordance therewith generating first and second pluralities of sequentially time delayed signals as said first and second pluralities of temporally related signals.

30. The method of claim 28, wherein said step of receiving said desired response signal and said example input signal and in accordance therewith generating first and second pluralities of temporally related signals comprises receiving and selectively shifting said desired response signal and said example input signal with first and second shift registers and in accordance therewith generating first and second pluralities of sequentially time shifted signals as said first and second pluralities of temporally related signals.

31. The method of claim 28, wherein:

said step of receiving and back propagating an error signal with a neural network comprises receiving and back propagating an error signal with a multiple layer perceptron; and said step of processing said first and second pluralities of temporally related signals together simultaneously and in accordance therewith generating said control signal with said neural network comprises inputting said first and second pluralities of temporally related signals to first and second pluralities of inputs and outputting said control signal from an output of said multiple layer perceptron.

32. The method of claim 26, wherein said step of processing said control signal and said inverse model signal and in accordance therewith generating said error signal comprises combining said control signal and said inverse model signal and in accordance therewith generating said error signal.

33. The method of claim 26, wherein said step of receiving said desired response signal and generating an inverse model signal in accordance with a transfer function comprises receiving said desired response signal and generating an inverse model signal in accordance with a transfer function which represents an inverse circuit model of a signal controlled oscillator.

34. The method of claim 26, wherein said step of receiving said desired response signal and generating an inverse model signal in accordance with a transfer function comprises receiving said desired response signal and generating an inverse model signal in accordance with a transfer function which represents an inverse circuit model of a serially coupled signal controlled oscillator and filter.

* * * * *

UNITED STATES PATENT AND TRADEMARK OFFICE
CERTIFICATE OF CORRECTION

PATENT NO. : 5,705,956
DATED : January 6, 1998
INVENTOR(S) : William Shields Neely It is certified that error appears in the above-identified patent and that said Letters Patent is hereby corrected as shown below:

In Col. 5, line 24, delete "perception" and replace with --perceptron--.

In Col. 7, line 28, delete "perception" and replace with --perceptron--.

Signed and Sealed this

Twenty-fourth Day of March, 1998

Attest:

BRUCE LEHMAN

*Attesting Officer*  *Commissioner of Patents and Trademarks*